United States Patent
Andre

(10) Patent No.: US 8,355,272 B2
(45) Date of Patent: Jan. 15, 2013

(54) MEMORY ARRAY HAVING LOCAL SOURCE LINES

(75) Inventor: Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 204 days.

(21) Appl. No.: 12/975,519

(22) Filed: Dec. 22, 2010

(65) Prior Publication Data

US 2012/0163061 A1    Jun. 28, 2012

(51) Int. Cl.
    *G11C 11/00* (2006.01)
(52) U.S. Cl. ......................... 365/148; 365/157
(58) Field of Classification Search .................. 365/148, 365/157, 189.15, 189.16
    See application file for complete search history.

(56) References Cited

U.S. PATENT DOCUMENTS

| | | |
|---|---|---|
| 2007/0279968 A1 | 12/2007 | Luo et al. |
| 2010/0054020 A1 | 3/2010 | Ueda |
| 2010/0214834 A1 | 8/2010 | Hidako |
| 2011/0194361 A1* | 8/2011 | Kawahara et al. ....... 365/189.09 |
| 2012/0092921 A1* | 4/2012 | Ono et al. ..................... 365/148 |

OTHER PUBLICATIONS

PCT Search Report mailed Apr. 11, 2012 in PCT/US11/66208.

* cited by examiner

*Primary Examiner* — Vu Le
(74) *Attorney, Agent, or Firm* — Ingrassia Fisher & Lorenz, PC

(57) ABSTRACT

A memory is provided that simplifies a fabrication process and structure by reducing the number of source lines and bitlines accessible to circuitry outside of the memory array. The memory has first and second row groups comprising a plurality of memory elements each coupled to one each of a plurality of M bit lines; first and second local source lines and first and second word lines, each coupled to each of the plurality of memory elements; and circuitry coupled to the first and second word lines and configured to select one of the first and second row groups, and coupled to the plurality of M bit lines and configured to apply current of magnitude N through the memory element in the selected row group coupled to one of the plurality of M bit lines by applying current of magnitude less than N to two or more of the remaining M-1 bit lines.

20 Claims, 4 Drawing Sheets

MEMORY ARRAY HAVING LOCAL SOURCE LINES

TECHNICAL FIELD

The exemplary embodiments described herein generally relate to magnetoresistive memories and more particularly to spin-torque magnetoresistive random access memory (MRAM) arrays having a simplified fabrication process and structure.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronic information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element. In some device designs the free magnetic layer of the MTJ may have stable magnetic states with magnetization in the film plane, and in other cases the stable states have magnetization perpendicular to the plane. In-plane devices typically have their magnetic easy axis defined by the in-plane shape of the free layer and perpendicular devices typically employ materials with a perpendicular magnetic anisotropy (PMA) that create a perpendicular easy axis.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, the number of metal connect lines (bit lines, word line, etc.) can limit the scalability of ST-MRAM.

All known ST-MRAM bitcell layouts that support bi-directional current use one bitline per column connected to each memory element and a separate current path, parallel to the bitline, connected to the source of select transistors, each select transistor connected to the other end of each memory element, the source lines and bitlines driven to a voltage level by circuitry outside of the memory array. Known devices typically connect to the top of the MTJ on an upper level metal while connecting to the select transistor on a lower level metal. Use of the lower source line typically requires >$20f^2$ area in a standard CMOS process, due to the area required for the source line along with the area required for the connection up from the select device to the bottom of the MTJ.

Accordingly, it is desirable to provide ST-MRAM structures that provide a simplified fabrication process and structure by reducing the number of source lines and bitlines accessible to circuitry outside of the memory array. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A memory is provided that simplifies a fabrication process and structure by reducing the number of source lines and bitlines accessible to circuitry outside of the memory array.

In an exemplary embodiment, the memory has a first plurality of memory elements comprising a first row group, each of the first plurality of memory elements having a first terminal, a second terminal, and a third terminal; a second plurality of memory elements comprising a second row group, each of the second plurality of memory elements having a fourth terminal, a fifth terminal, and a sixth terminal; a first plurality of M bit lines, each configured to be coupled to one of the first terminals and one of the fourth terminals; a first local source line coupled to the second terminals; a second local source line coupled to the fifth terminals; a first word line coupled to the third terminals; a second word line coupled to the sixth terminals; and circuitry coupled to the first and second word lines and configured to select one of the first and second row groups, and coupled to the plurality of M bit lines and configured to apply current of magnitude N through the memory element in the selected row group coupled to one of the plurality of M bit lines by applying current of magnitude less than N to two or more of the remaining M-1 bit lines.

In another exemplary embodiment, the memory has a first plurality of M memory elements comprising a first row group; a second plurality of M memory elements comprising a second row group, each of the first plurality of M memory elements and each of the second plurality of M memory elements comprising a storage device for storing the state of the memory element, the storage device having a first terminal and a second terminal; a transistor having a first current electrode coupled to the first terminal of the storage device, a second current electrode, and a control electrode; a plurality of M bit lines, each configured to be coupled to the second terminal of one storage device in the first plurality of M memory elements and the second terminal of one storage device in the second plurality of M memory elements; a first local source line coupled to the second current electrode of the transistor in each of the first plurality of M memory elements; a second local source line coupled to the second current electrode of the transistor in each of the second plurality of M memory elements; a first word line coupled to the control electrode of each of the first plurality of M memory elements; a second word line coupled to the control electrode of each of the second plurality of M memory elements; and circuitry coupled to the first and second word lines and configured to select one row group along the plurality of M bit lines, and coupled to the plurality of M bit lines and configured to apply current of magnitude N through the memory element in the selected row group coupled to one of the plurality of M bit lines by applying current of magnitude less than N to two or more of the remaining M-1 bit lines.

In yet another exemplary embodiment, the memory has a first plurality of M memory elements comprising a first row group; a second plurality of M memory elements comprising a second row group, each of the first plurality of M memory elements and the second plurality of M memory elements comprising a storage device for storing the state of the memory element, the storage device having a first terminal and a second terminal; a transistor having a first current electrode coupled to the first terminal of the storage device, a second current electrode, and a control electrode; a plurality of M bit lines, each configured to be coupled to the second electrode of one transistor in the first plurality of M memory elements and the second electrode of one transistor in the second plurality of M memory elements; a first local source line coupled to the second terminal of the storage device in each of the first plurality of M memory elements; a second local source line coupled to the second terminal of the storage device in each of the second plurality of M memory elements; a first word line coupled to the control electrode of each of the first plurality of M memory elements; a second word line coupled to the control electrode of each of the second plurality of M memory elements; and circuitry coupled to the first and second word lines for selecting one row group along the plurality of M bit lines, and coupled to the plurality of M bit lines and configured to apply current of magnitude N through the memory element in the selected row group coupled to one of the plurality of M bit lines by applying current of magnitude less than N to two or more of the remaining M-1 bit lines.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A magnetoresistive random access memory (MRAM) array described herein eliminates the need for a lower bit line required in previously known arrays. The memory includes a first plurality of memory elements comprising a first row group and a second plurality of memory elements comprising a second row group. A first plurality of M bit lines are coupled to the first and second row groups, while a first local source line is coupled to the first row group and a second local source line is coupled to the second row group, while a first word line coupled to the first row group and a second word line coupled to the second row group. Circuitry is coupled to the first and second word lines for selecting one row group and to the plurality of M bit lines and configured to apply current of magnitude N through the memory element in the selected row group coupled to one of the plurality of M bit lines by applying current of magnitude less than N to two or more of the remaining M-1 bit lines.

Figure 1:
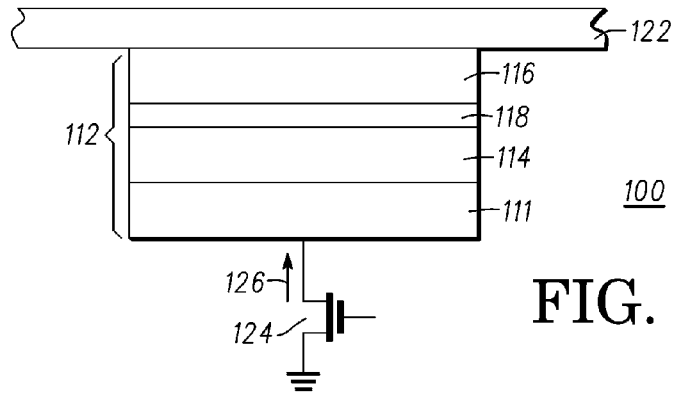
FIG. 1 is a typical spin-torque memory cell.
Figure 3:
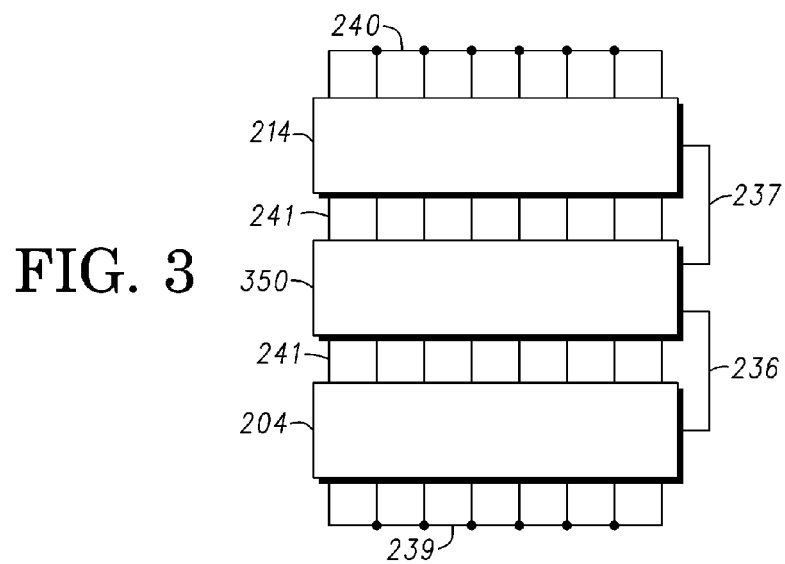
FIG. 3 is a block diagram of the spin-torque MRAM memory element array, and selection circuitry, in accordance with the exemplary embodiment of FIG. 2.

While the exemplary embodiments described herein include a spin-torque magnetoresistive technology, other types of memories that require positive and negative voltage bias across the memory element during read and/or write operations, such as resistive RAM, may be used. MRAM technology uses magnetic components to achieve non-volatility, high-speed operation, and excellent read/write endurance. FIG. 1 is an exemplary conventional spin-torque magnetoresistive memory cell 100 that may be used in the exemplary embodiments of the array described herein. The spin-torque magnetoresistive memory cell 100 includes a storage device 112 (also referred herein as memory element 112) and an isolation transistor 124. The memory element 112, for example, a magnetic tunnel junction (MTJ) element, comprises a fixed ferromagnetic layer 114 that has a magnetization direction fixed with respect to an external magnetic field and a free ferromagnetic layer 116 that has a magnetization direction that is free to rotate with the external magnetic field. The fixed layer and free layer are separated by an insulating tunnel barrier layer 118. The resistance of memory element 112 relies upon the phenomenon of spin-polarized electron tunneling through the tunnel barrier layer between the free and fixed ferromagnetic layers. The tunneling phenomenon is electron spin dependent, making the electrical response of the MTJ element a function of the relative magnetization orientations and spin polarization of the conduction electrons between the free and fixed ferromagnetic layers.

The spin-torque magnetoresistive memory cell 100 includes conductor 122, also referred to as bit line 122, extending along columns of the storage devices 112, and conductor 111, also referred to as a bottom electrode 111, electrically contacting the fixed layer 114. The magnetization direction of the free layer 116 of a memory element 112 is switched by supplying currents to bottom electrode 111 and bit line 122. In ST-MRAM devices such as the structure 100 shown in FIG. 1, the bits are written by using isolation transistor 124 to force a current 126 directly through the stack of materials that make up the storage device 112 (magnetic tunnel junction). Generally speaking, the write current 126 which is spin polarized by passing through one ferromagnetic layer (114 or 116), exerts a spin torque on the subsequent layer. This torque can be used to switch the magnetization of free ferromagnetic layer 116 between two stable states by changing the write current polarity.

While the exemplary embodiment described above teaches the free layer 116 adjacent the conductor 122, in another embodiment, the fixed layer 111 may be adjacent the conductor 122 while the free layer 116 would be coupled to the isolation transistor 124.

The spin-torque effect is known to those skilled in the art. Briefly, a current becomes spin-polarized after the electrons pass through the first magnetic layer in a magnet/non-magnet/magnet trilayer structure, where the first magnetic layer is substantially fixed in its magnetic orientation by any one of a number of methods known in the art. The spin-polarized electrons cross the nonmagnetic spacer and then, through conservation of spin angular momentum, exert a spin torque on the second magnetic layer, which switches the magnetic orientation of the second layer to be parallel to the magnetic orientation of the first layer. If a current of the opposite polarity is applied, the electrons instead pass first through the second magnetic layer. After crossing the nonmagnetic spacer, a spin torque is applied to the first magnetic layer. However, since its magnetization is fixed, the first magnetic layer does not switch. Simultaneously, a fraction of the electrons will then reflect off the first magnetic layer and travel back across the nonmagnetic spacer before interacting with the second magnetic layer. In this case, the spin torque acts so as to switch the magnetic orientation of the second layer to be anti-parallel to the magnetic orientation of the first layer. Spin-torque switching occurs only when the current 126 exceeds the critical current $I_C$ of the element. The spin-torque switching current used by the circuit is chosen to be somewhat above the average $I_C$ of the memory elements so that all elements will switch reliably when the switching current is applied.

Figure 2:
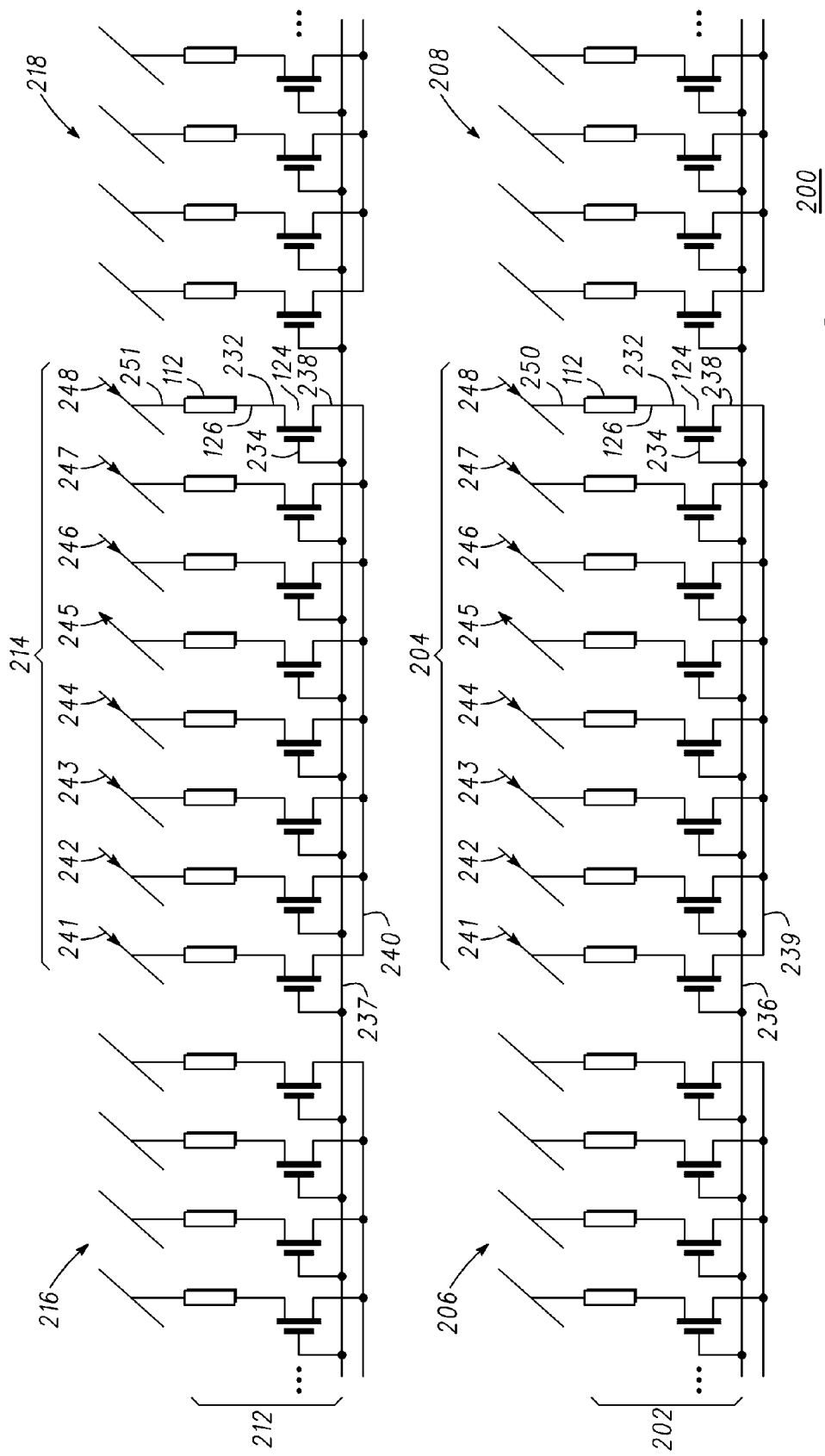
FIG. 2 is a spin-torque MRAM memory element array in accordance with an exemplary embodiment.

Referring to FIG. 2, an exemplary embodiment of a spin-torque MRAM array 200 has a first plurality of memory elements 202 including a first row group 204 and first additional row groups 206, 208 and a second plurality of storage devices 212 including a second row group 214 and second additional row groups 216, 218.

Each of the isolation transistors 124 in the first plurality of memory elements 202 has a current electrode 232 coupled to one of the storage devices 112, a control electrode 234 coupled to a word line 236, and a current electrode 238 (also referred to as a first terminal) coupled to a local source line 239. A plurality of bit lines 241, 242, 243, 244, 245, 246, 247, 248 are each individually coupled to one of the storage devices 112 of the first row group 204 at a second terminal 250.

In a similar manner, each of the isolation transistors 124 in the second plurality of memory elements 212 has a current electrode 232 coupled to one of the storage devices 112, a control electrode 234 coupled to a word line 237, and a current electrode 238 (also referred to as a first terminal) coupled to a local source line 240. The plurality of bit lines 241, 242, 243, 244, 245, 246, 247, 248 are individually coupled to one of the storage devices 112 of the second row group 214 at a second terminal 251.

Although eight storage devices 112 and eight isolation transistors 124 are included in the each of the first and second row groups 204, 214, any number of storage devices 112 and equal number of isolation transistors 124 could be included. Typically, an equal number of storage devices 112 would be included in each of the row groups 204, 214 and each of the additional row groups 206, 208, 216, 218.

In operation, referring to FIG. 2 and the block diagram of 3, circuitry 350 applies a voltage to one or more of the word lines 236, 237 to select one or more of the row groups 204, 214. A current I/7 is applied to all but one of the bit lines 241, 242, 243, 244, 245, 246, 247, 248 and returned (as current I) to the circuitry from the other of the bit lines 241, 242, 243, 244, 245, 246, 247, 248. For example, the current I/7 is applied to each of the bit lines 241, 242, 243, 244, 246, 247, 248, passing through the storage devices 112 and isolation transistors 124 associated therewith, through the local source line 239, 240, through the isolation transistor 124 and storage device 112 associated with bit line 245, through the bit line 245, and back to circuitry 350. The current I/7 is of insufficient magnitude to write the storage devices 112 associated with bit lines 241, 242, 243, 244, 246, 247, 248, while the current I is sufficient to write the storage device 112 associated with bit line 245. The storage devices may be read in a similar manner, but with a current of smaller magnitude.

Figure 4:
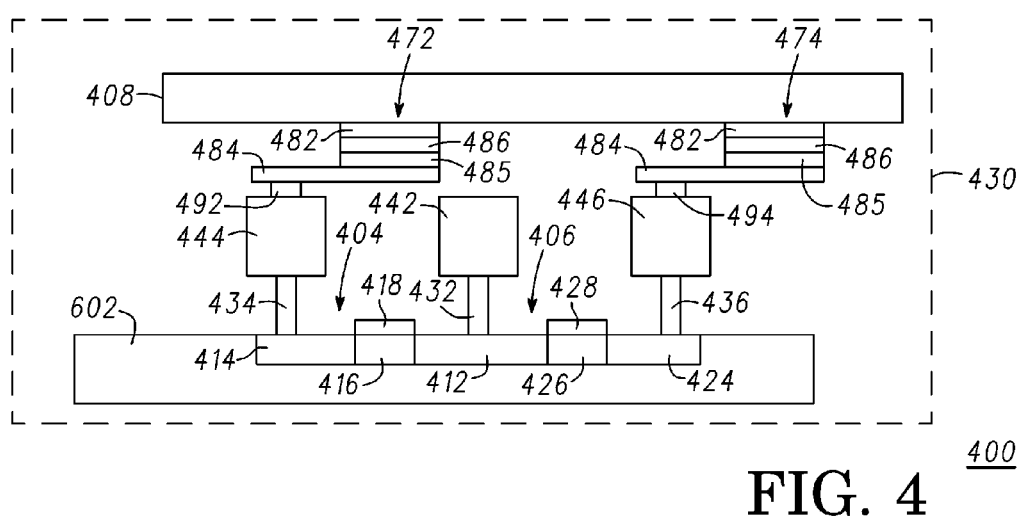
FIG. 4 is an exemplary partial cross section of two cells of the spin-torque integrated array in accordance with the exemplary embodiment of FIG. 2.

Referring to FIG. 4, an exemplary magnetoresistive memory array 400 includes switching devices 404 and 406 formed within and on the substrate 402 in a manner well known in the semiconductor industry. The switching device 404 includes electrodes 412, 414, channel region 416, and gate 418. The switching device 406 includes electrodes 412, 424, channel region 426, and gate 428.

Vias 432, 434, 436 are formed in the dielectric material 430 to couple the electrode 412 to conductive region 442, electrode 414 to conductive region 444, and electrode 424 to conductive region 446, respectively. Conductive regions 442, 444, 446 are formed in the same processing steps and isolated from each other by processes known in the semiconductor industry.

Scalable magnetoresistive memory elements 472, 474 are formed within the dielectric material 430. When MTJ devices are used, each includes a free layer 482 and a fixed region 485 over a bottom electrode 484 and separated by a tunnel barrier 486. In this illustration, only two magnetoresistive memory elements 472, 474 are shown for simplicity in describing the embodiments of the present invention, but it will be understood that an MRAM array may include many magnetoresistive memory elements. The free layer 482 is coupled to a first conductive line 408.

The fixed magnetic region 485 is well known in the art, and conventionally includes a pinned synthetic antiferromagnet, which includes a ferromagnetic fixed layer, a coupling spacer layer, a pinned ferromagnetic layer and an optional antiferromagnetic pinning layer. The fixed ferromagnetic layer is positioned in contact with the tunnel barrier. The coupling spacer layer is position between the fixed ferromagnetic layer and the pinned ferromagnetic layer. The antiferromagnetic pinning layer is underneath and in contact with the pinned ferromagnetic layer. The ferromagnetic fixed and pinned layers each have a magnetic moment vector that are usually held anti-parallel by the coupling spacer layer and held in a fixed direction by the antiferromagnetic pinning layer. Thus the magnetic moment vector of fixed magnetic region 485 is not free to rotate and is used as a reference. The coupling spacer layer is formed from any suitable nonmagnetic material that creates antiparallel coupling between two ferromagnetic layers adjacent to, and in contact with, its opposite surfaces. The coupling layer is typically one that exhibits the oscillatory coupling phenomenon, for example, at least one of the elements Ru, Os, Re, Cr, Rh, Cu, or their combinations, with a thickness chosen for strong antiparallel coupling. The optional pinning layer, may comprise antiferromagnetic materials such as PtMn, IrMn, FeMn, PdMn, or combinations thereof. However, it will be appreciated by those skilled in the art that fixed magnetic region 485 may have any structure suitable for providing a fixed magnetic portion in contact with the tunnel barrier to provide a fixed magnetic reference direction.

The free layer 482 has a magnetic moment vector that is free to rotate in response to a STT current (discussed hereinafter). In the absence of the STT current, the magnetic moment vector is oriented along the anisotropy easy-axis of the free layer. The magnetic vector of the free layer 482 is free to rotate in the presence of an applied field or a STT current. The magnetic vector of the fixed layer 485 is not free to rotate in the presence of an STT current and is used as the reference layer.

The free layer 482, the fixed layer 485 may be formed from any suitable ferromagnetic material, such as at least one of the elements Ni, Fe, Co or their alloys and their other useful alloys incorporating other elements, such as B, Ta, V, Si, and C, as well as so-called half-metallic ferromagnets such as NiMnSb, PtMnSb, $Fe_3O_4$, or $CrO_2$. The tunnel barrier 486 may be comprised of insulating materials such as AlOx, MgOx, RuOx, HfOx, ZrOx, TiOx, or the nitrides and oxidinitrides of these elements.

The dielectric material 430 may be silicon oxide, silicon nitride (SiN), silicon oxynitride (SiON), a polyimide, or combinations thereof. The conductive lines 408 and vias 432, 434, 436 are preferably copper, but it will be understood that they may be other materials such as tantalum, tantalum nitride, silver, gold, aluminum, platinum, or another suitable conductive material.

During fabrication of the MRAM array architecture 400, each succeeding layer is deposited or otherwise formed in sequence and each MTJ device 400 may be defined by selective deposition, photolithography processing, etching, etc. using any of the techniques known in the semiconductor industry. Typically the layers of the MTJ are formed by thin-film deposition techniques such as physical vapor deposition, including magnetron sputtering and ion beam deposition, or thermal evaporation. During deposition of at least a portion of the MTJ, a magnetic field is provided to set a preferred anisotropy easy-axis into the material (induced intrinsic anisotropy). In addition, the MTJ stack is typically annealed at elevated temperature while exposed to a magnetic field directed along the preferred anisotropy easy-axis to further set the intrinsic anisotropy direction and to set the pinning direction when an antiferromagnetic pinning layer is used. The provided magnetic field creates a preferred anisotropy easy-axis for a magnetic moment vector in the ferromagnetic materials. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element. In some cases it may be advantageous to employ free layer materials that have a strong perpendicular magnetic anisotropy (PMA) such that the easy axis of the free layer is perpendicular to the film plane and the two stable magnetic states are characterized by a magnetization vector directed generally toward or away from the tunnel barrier. Such PMA materials known in the art include certain ordered L10 alloys such as: FePt, FePd, CoPt, FeNiPt; and certain artificial multilayered structures such as: Co/Pt, Co/Pd, CoCr/Pt, Co/Ru, Co/Au, Ni/Co.

Figure 5:
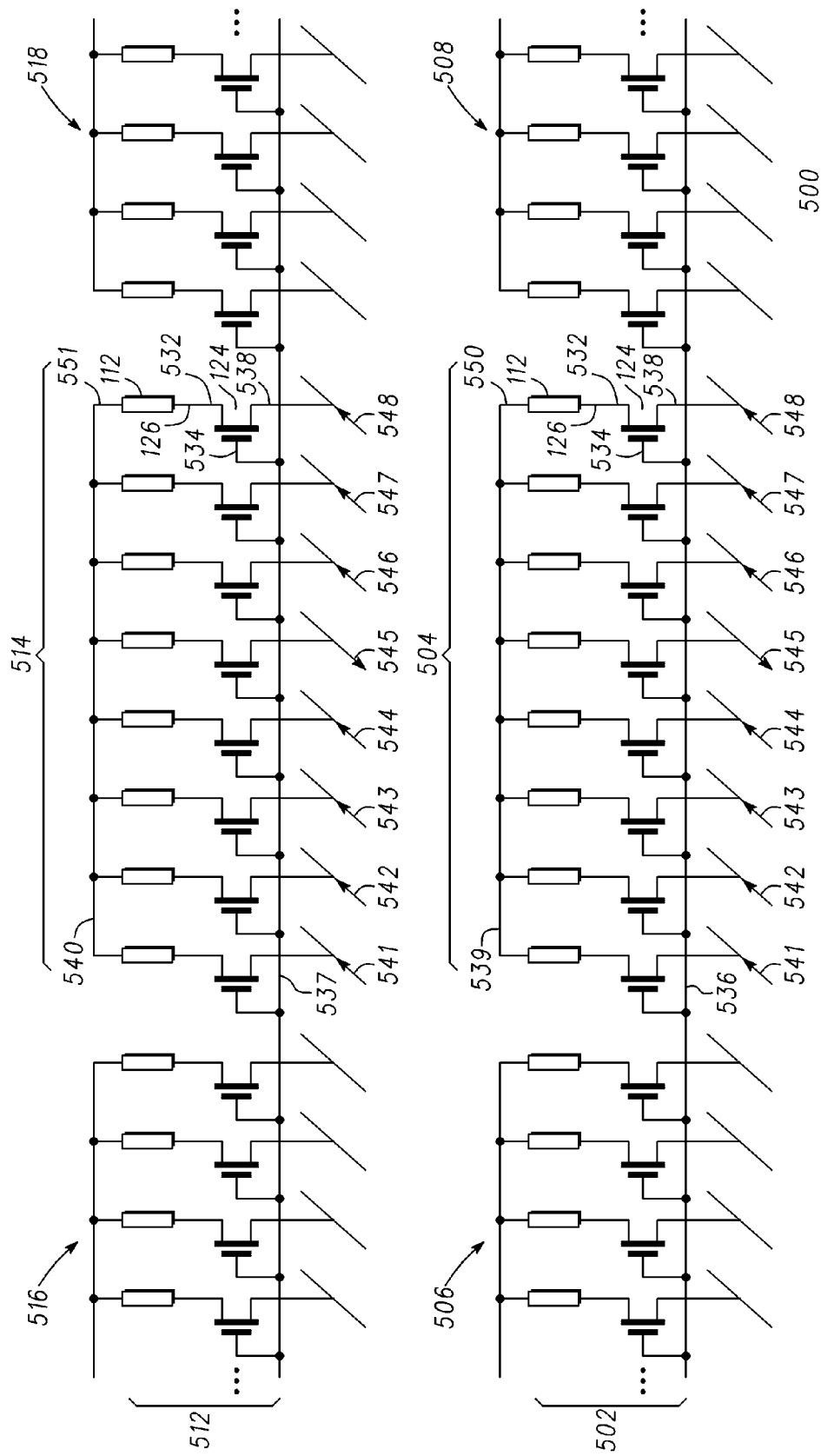
FIG. 5 is a spin-torque MRAM memory element array in accordance with another exemplary embodiment.
Figure 6:
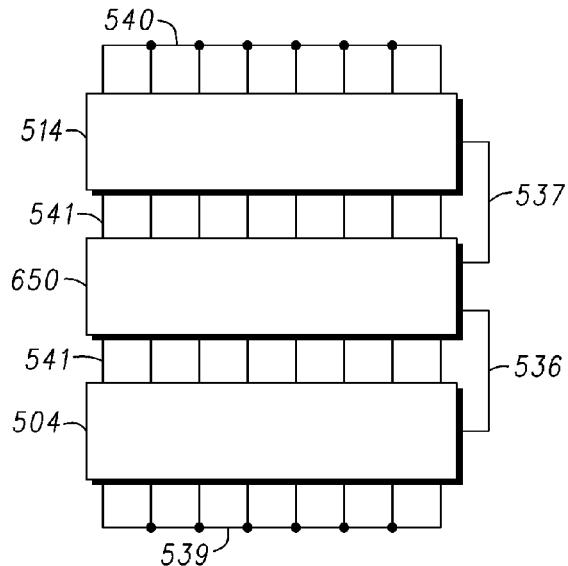
FIG. 6 is a block diagram of the spin-torque MRAM memory element array, and selection circuitry, in accordance with the exemplary embodiment of FIG. 5.

Referring to FIG. 5, another exemplary embodiment of a spin-torque MRAM array 500 has a first plurality of memory elements 502 including a first row group 504 and first additional row groups 506, 508 and a second plurality of storage devices 512 including a second row group 514 and second additional row groups 516, 518.

Each of the isolation transistors 124 in the first plurality of memory elements 502 has a current electrode 532 coupled to one of the storage devices 112, a control electrode 534 coupled to a word line 536, and a current electrode 538 (also referred to as a first terminal) coupled to one of a plurality of bit lines 541, 542, 543, 544, 545, 546, 547, 548. A local source line 539 is coupled to each of the storage devices 112 of the first row group 504 at a second terminal 550.

In a similar manner, each of the isolation transistors 124 in the second plurality of memory elements 512 has a current electrode 532 coupled to one of the storage devices 112, a control electrode 534 coupled to a word line 537, and a current electrode 538 (also referred to as a first terminal) coupled to one of a plurality of bit lines 541, 542, 543, 544, 545, 546, 547, 548. A local source line 540 is coupled to each of the storage devices 112 of the second row group 514 at a second terminal 551.

Although eight storage devices 112 and eight isolation transistors 124 are included in the each of the first and second row groups 504, 514, any number of storage devices 112 and equal number of isolation transistors 124 could be included. Typically, an equal number of storage devices 112 would be included in each of the row groups 504, 514 and each of the additional row groups 506, 508, 516, 518.

In operation, referring to FIG. 5 and the block diagram of 6, circuitry 650 applies a voltage to one or more of the word lines 536, 537 to select one or more of the row groups 504, 514. A current I/7 is applied to all but one of the bit lines 541, 542, 543, 544, 545, 546, 547, 548 and returned (as current I) to the circuitry from the other of the bit lines 541, 542, 543, 544, 545, 546, 547, 548. For example, the current I/7 is applied to each of the bit lines 541, 542, 543, 544, 546, 547, 548, passing through the storage devices 112 and isolation transistors 124 associated therewith, through the local source line 539, 540, through the isolation transistor 124 and storage device 112 associated with bit line 545, through the bit line 545, and back to circuitry 650. The current I/7 is of insufficient magnitude to write the storage devices 112 associated with bit lines 541, 542, 543, 544, 546, 547, 548, while the current I is sufficient to write the storage device 112 associated with bit line 545. The storage devices may be read in a similar manner, but with a current of smaller magnitude.

Figure 7:
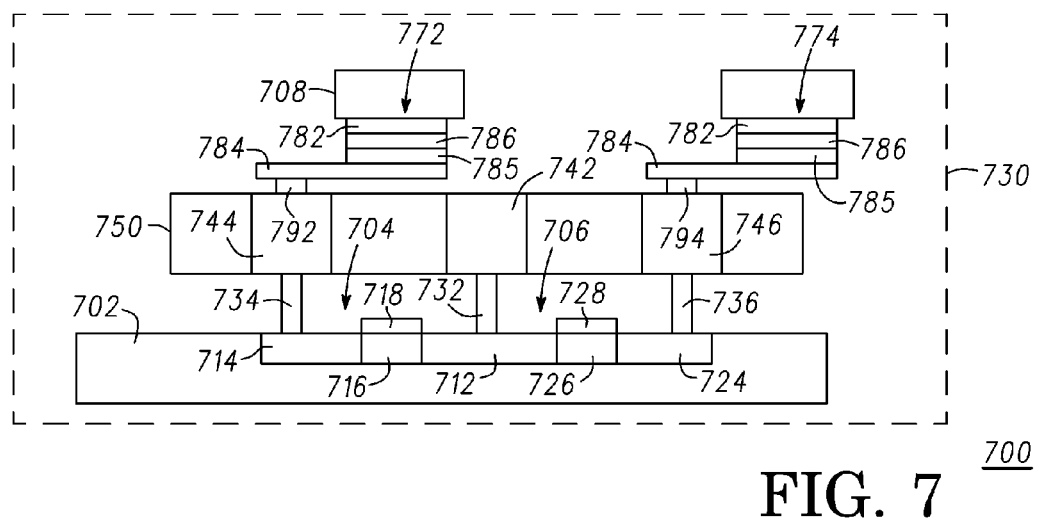
FIG. 7 is an exemplary partial cross section of two cells of the spin-torque integrated array in accordance with the exemplary embodiment of FIG. 5.

Referring to the partial cross section view of FIG. 7, an exemplary magnetoresistive memory array 700 includes switching devices 704 and 706 formed within and on the substrate 702 in a manner well known in the semiconductor industry. The switching device 704 includes electrodes 712, 714, channel region 716, and gate 718. The switching device 706 includes electrodes 712, 724, channel region 726, and gate 728.

Vias 732, 734, 736 are formed in the dielectric material 730 to couple the electrode 712 to conductive region 742, electrode 714 to conductive region 744, and electrode 724 to conductive region 746, respectively. Conductive regions 742, 744, 746 are formed in the same processing steps and isolated from each other by processes known in the semiconductor industry. The fixed region 785 of magnetoresistive memory element 772 is coupled to the conductive region 742 by via 792, and the fixed region 785 of magnetoresistive memory element 774 is coupled to the conductive region 746 by via 794. Bitline 750 is coupled to conductive region 742.

Scalable magnetoresistive memory elements 772, 774 are formed within the dielectric material 730. When MTJ devices are used, each includes a free layer 782 and a fixed region 785 over a bottom electrode 784 and separated by a tunnel barrier 786. In this illustration, only two magnetoresistive memory elements 772, 774 are shown for simplicity in describing the embodiments of the present invention, but it will be understood that an MRAM array may include many magnetoresistive memory elements. The free layer 782 is coupled to a local source line 708.

The fixed magnetic region 785 is well known in the art, and conventionally includes a pinned synthetic antiferromagnet, which includes a ferromagnetic fixed layer, a coupling spacer layer, a pinned ferromagnetic layer and an optional antiferromagnetic pinning layer. The fixed ferromagnetic layer is positioned in contact with the tunnel barrier. The coupling spacer layer is position between the fixed ferromagnetic layer and the pinned ferromagnetic layer. The antiferromagnetic pinning layer is underneath and in contact with the pinned ferromagnetic layer. The ferromagnetic fixed and pinned layers each have a magnetic moment vector that are usually held anti-parallel by the coupling spacer layer and held in a fixed direction by the antiferromagnetic pinning layer. Thus the magnetic moment vector of fixed magnetic region 785 is not free to rotate and is used as a reference. The coupling spacer layer is formed from any suitable nonmagnetic material that creates antiparallel coupling between two ferromagnetic layers adjacent to, and in contact with, its opposite surfaces. The coupling layer is typically one that exhibits the oscillatory coupling phenomenon, for example, at least one of the elements Ru, Os, Re, Cr, Rh, Cu, or their combinations, with a thickness chosen for strong antiparallel coupling. The optional pinning layer, may comprise antiferromagnetic materials such as PtMn, IrMn, FeMn, PdMn, or combinations thereof. However, it will be appreciated by those skilled in the art that fixed magnetic region 785 may have any structure suitable for providing a fixed magnetic portion in contact with the tunnel barrier to provide a fixed magnetic reference direction.

The free layer 782 has a magnetic moment vector that is free to rotate in response to a STT current (discussed hereinafter). In the absence of the STT current, the magnetic moment vector is oriented along the anisotropy easy-axis of the free layer.

The magnetic vector of the fixed layer 785 is not free to rotate in the presence of an STT current and is used as the reference layer.

The free layer 782 and the fixed layer 785 may be formed from any suitable ferromagnetic material, such as at least one of the elements Ni, Fe, Co or their alloys and their other useful alloys incorporating other elements, such as B, Ta, V, Si, and C, as well as so-called half-metallic ferromagnets such as NiMnSb, PtMnSb, $Fe_3O_4$, or $CrO_2$. The tunnel barrier 786 may be comprised of insulating materials such as AlOx, MgOx, RuOx, HfOx, ZrOx, TiOx, or the nitrides and oxidinitrides of these elements.

The dielectric material 730 may be silicon oxide, silicon nitride (SiN), silicon oxynitride (SiON), a polyimide, or combinations thereof. The conductive lines 708 and vias 732, 734, 736, 750, 784, 785 are preferably copper, but it will be understood that they may be other materials such as tantalum, tantalum nitride, silver, gold, aluminum, platinum, or another suitable conductive material.

During fabrication of the MRAM array architecture 700, each succeeding layer is deposited or otherwise formed in sequence and each MTJ device 700 may be defined by selective deposition, photolithography processing, etching, etc. using any of the techniques known in the semiconductor industry. Typically the layers of the MTJ are formed by thin-film deposition techniques such as physical vapor deposition, including magnetron sputtering and ion beam deposition, or thermal evaporation. During deposition of at least a portion of the MTJ, a magnetic field is provided to set a preferred anisotropy easy-axis into the material (induced intrinsic anisotropy). In addition, the MTJ stack is typically annealed at elevated temperature while exposed to a magnetic field directed along the preferred anisotropy easy-axis to further set the intrinsic anisotropy direction and to set the pinning direction when an antiferromagnetic pinning layer is used. The provided magnetic field creates a preferred anisotropy easy-axis for a magnetic moment vector in the ferromagnetic materials. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element. In some cases it may be advantageous to employ free layer materials that have a strong perpendicular magnetic anisotropy (PMA) such that the easy axis of the free layer is perpendicular to the film plane and the two stable magnetic states are characterized by a magnetization vector directed generally toward or away from the tunnel barrier. Such PMA materials known in the art include certain ordered L10 alloys such as: FePt, FePd, CoPt, FeNiPt; and certain artificial multilayered structures such as: Co/Pt, Co/Pd, CoCr/Pt, Co/Ru, Co/Au, Ni/Co.

Figure 8:
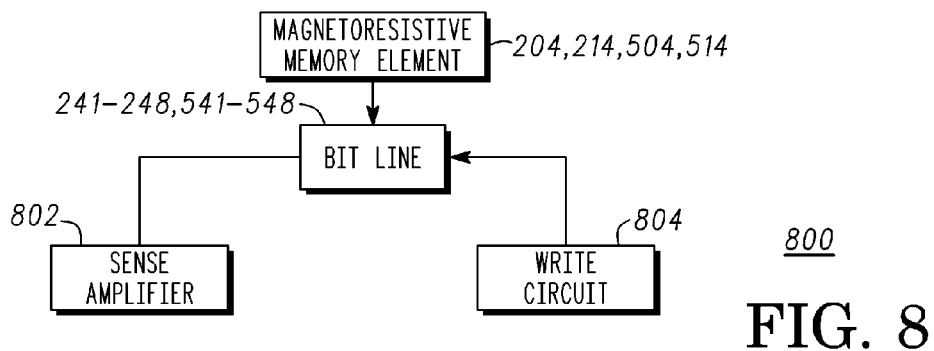
FIG. 8 is a block diagram of an exemplary embodiment including a sense amplifier and write circuit.

FIG. 8 is a block diagram of a typical sensing circuit 800 that may be used in the magnetoresistive memories 200, 400, 500, 700. A sense amplifier 802 and a write circuit 804 are coupled to the bit line 241-248 and 541-548 of FIGS. 2-7. The sense amplifier 802 senses the resistance of the magnetoresistive memory elements 204, 214, 504, 514. Write circuitry 804 is used to program the magnetoresistive memory elements 204, 214, 504, 514.

A structure has been disclosed that eliminates a source line accessible to circuitry outside the memory array in a memory that requires positive and negative voltage bias across memory elements in an array to read and/or write the state of the memory elements. Through use of a subset of a group of bitlines to provide a current path through a memory element on a single bitline of the subset, the need for a source line parallel to the single bitline is eliminated. A local source line perpendicular to the bitlines is coupled through the memory elements and select devices to the parallel bitlines to enable the current path. The local source line can be connected to the select transistors of a group of bits or to the memory elements within a group of bits. In an alternate embodiment, one of the group of bitlines is used to sense the voltage on the local source line. Multiple groups of memory elements along a row and/or along a column can be used to build an array.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A memory comprising:
a first plurality of memory elements comprising a first row group, each of the first plurality of memory elements having a first terminal, a second terminal, and a third terminal;
a second plurality of memory elements comprising a second row group, each of the second plurality of memory elements having a fourth terminal, a fifth terminal, and a sixth terminal;
a first plurality of M bit lines, each configured to be coupled to one of the first terminals and one of the fourth terminals;
a first local source line coupled to the second terminals;
a second local source line coupled to the fifth terminals;
a first word line coupled to the third terminals;
a second word line coupled to the sixth terminals; and
circuitry coupled to the first and second word lines and configured to select one of the first and second row groups, and coupled to the first plurality of M bit lines and configured to apply a current of magnitude N through the memory element in the selected row group coupled to one of the first plurality of M bit lines by applying the current of magnitude less than N to two or more of the remaining M-1 bit lines.

2. The memory of claim 1, wherein the current of magnitude N may flow in either direction between the first and second terminals of the first plurality of memory elements, or between the fourth and fifth terminals of the second plurality of memory elements.

3. The memory of claim 1, wherein each of the first and second plurality of memory elements comprise a magnetic tunnel junction.

4. The memory of claim 1, wherein the current of magnitude N changes a state of the memory element in the selected row group, and the current of magnitude less than N does not change the state of the memory elements coupled to the remaining M-1 bit lines.

5. The memory of claim 1, wherein the circuitry providing the current of magnitude N is configured to read the state of the memory element in the selected row group.

6. The memory of claim 1, wherein the circuitry is configured to detect a voltage applied to the local source line of a selected row group through one of the remaining M-1 bit lines.

7. The memory of claim 1, further comprising:
a third plurality of memory elements comprising a third row group and having a seventh terminal, an eighth terminal, and a ninth terminal, the ninth terminal coupled to the first word line;
a second plurality of M bit lines, each configured to be coupled to the seventh terminal; and
a third local source line coupled to the eighth terminal.

8. The memory of claim 7, wherein the third local source line is coupled to the first local source line.

9. A memory comprising:
a first plurality of M memory elements comprising a first row group;
a second plurality of M memory elements comprising a second row group, each of the first plurality of M memory elements and each of the second plurality of M memory elements comprising:
a storage device for storing a state of the memory element, the storage device having a first terminal and a second terminal;
a transistor having a first current electrode coupled to the first terminal of the storage device, a second current electrode, and a control electrode;
a plurality of M bit lines, each configured to be coupled to the second terminal of one storage device in the first plurality of M memory elements and the second terminal of one storage device in the second plurality of M memory elements;
a first local source line coupled to the second current electrode of the transistor in each of the first plurality of M memory elements;
a second local source line coupled to the second current electrode of the transistor in each of the second plurality of M memory elements;
a first word line coupled to the control electrode of each of the first plurality of M memory elements;
a second word line coupled to the control electrode of each of the second plurality of M memory elements;
circuitry coupled to the first and second word lines and configured to select one row group along the plurality of M bit lines, and coupled to the plurality of M bit lines and configured to apply a current of magnitude N through the memory element in a selected row group coupled to one of the plurality of M bit lines by applying the current of magnitude less than N to two or more of the remaining M-1 bit lines.

10. The memory of claim 9, wherein each of the first and second plurality of memory elements comprise a magnetic tunnel junction.

11. The memory of claim 9, wherein the current of magnitude N changes the state of the memory element in the selected row group, and the current of magnitude less than N does not change the state of the memory elements coupled to the remaining M-1 bit lines.

12. The memory of claim 9, wherein the circuitry providing the current of magnitude N is configured to read the state of the memory element in the selected row group.

13. The memory of claim 9, wherein the circuitry is configured to detect the voltage applied to the local source line of a selected row group through one of the remaining M-1 bit lines.

14. The memory of claim 9, further comprising:
a third plurality of M memory elements comprising a third row group, each of the third plurality of M memory elements comprising the storage device and the transistor;
a second plurality of M bit lines, each configured to be coupled to the second terminal of one storage device in the third plurality of M memory elements; and
a third local source line coupled to the second current electrode of the transistor in each of the third plurality of M memory elements;
wherein the first word line is coupled to the control electrode of each of the third plurality of M memory elements.

15. A memory comprising:
a first plurality of M memory elements comprising a first row group;
a second plurality of M memory elements comprising a second row group, each of the first plurality of M memory elements and each of the second plurality of M memory elements comprising:

a storage device for storing a state of the memory element, the storage device having a first terminal and a second terminal;

a transistor having a first current electrode coupled to the first terminal of the storage device, a second current electrode, and a control electrode;

a plurality of M bit lines, each configured to be coupled to the second current electrode of one transistor in the first plurality of M memory elements and the second current electrode of one transistor in the second plurality of M memory elements;

a first local source line coupled to the second terminal of the storage device in each of the first plurality of M memory elements;

a second local source line coupled to the second terminal of the storage device in each of the second plurality of M memory elements;

a first word line coupled to the control electrode of each of the first plurality of M memory elements;

a second word line coupled to the control electrode of each of the second plurality of M memory elements;

circuitry coupled to the first and second word lines and configured to select one row group along the plurality of M bit lines, and coupled to the plurality of M bit lines and configured to apply current of magnitude N through the memory element in a selected row group coupled to one of the plurality of M bit lines by applying a current of magnitude less than N to two or more of the remaining M-1 bit lines.

16. The memory of claim 15, wherein each of the first and second plurality of memory elements comprise a magnetic tunnel junction.

17. The memory of claim 15, wherein the current of magnitude N changes the state of the memory element in the selected row group, and the current of magnitude less than N does not change the state of the memory elements coupled to the remaining M-1 bit lines.

18. The memory of claim 15, wherein the circuitry providing the current of magnitude N is configured to read the state of the memory element in the selected row group.

19. The memory of claim 15, wherein the circuitry is configured to detect a voltage applied to the local source line of a selected row group through one of the remaining M-1 bit lines.

20. The memory of claim 15, further comprising:

a third plurality of M memory elements comprising a third row group, each of the third plurality of M memory elements comprising the storage device and the transistor;

a second plurality of M bit lines, each configured to be coupled to the second terminal of one storage device in the third plurality of M memory elements; and a third local source line coupled to the second current electrode of the transistor in each of the third plurality of M memory elements;

wherein the first word line is coupled to the control electrode of each of the third plurality of M memory elements.

* * * * *